United States Patent [19]
Mueller et al.

[11] Patent Number: 5,877,994
[45] Date of Patent: Mar. 2, 1999

[54] SPACE-EFFICIENT MDQ SWITCH PLACEMENT

[75] Inventors: Gerhard Mueller, Wappingers Falls; Toshiaki Kirihata, Poughkeepsie, both of N.Y.

[73] Assignees: Siemens Aktiengesellschaft, Munich, Germany; International Business Machines Corporation, Armonk, N.Y.

[21] Appl. No.: 938,073

[22] Filed: Sep. 26, 1997

[51] Int. Cl.$^6$ .............................. G11C 7/02; G11C 8/00; G11C 5/02; G11C 5/06

[52] U.S. Cl. .......................... 365/207; 365/208; 365/51; 365/63; 365/230.06

[58] Field of Search ................ 365/51, 63, 207, 365/208, 230.06

[56] References Cited

U.S. PATENT DOCUMENTS 5,546,349  8/1996  Watanabe et al. .................. 365/63
5,636,158  6/1997  Kato et al. ............................. 365/63

OTHER PUBLICATIONS

"A 286mm$^2$ 256Mb DRAM with X32 Both–Ends DQ", by Watanabe et al., IEEE Journal of Solid–State Circuits, vol. 31, No. 4, Apr. 1996, pp. 567–574.

*Primary Examiner*—David Nelms
*Assistant Examiner*—Trong Phan
*Attorney, Agent, or Firm*—Stanton C. Braden

[57] ABSTRACT

A semiconductor memory having a plurality of memory cells arranged in rows and columns includes a bank of sense amplifiers disposed in a first generally rectangular region having a length parallel to said rows, with each sense amplifier in the bank disposed in a sense amplifier region between a pair of complementary bit lines of an associated column. An MDQ switch being located in a sense amplifier region occupying a corresponding row-wise space to the at least one driver to provide space efficient placement thereof.

8 Claims, 10 Drawing Sheets

SPACE-EFFICIENT MDQ SWITCH PLACEMENT

BACKGROUND OF THE INVENTION

1. Field of the Invention

The present invention relates to semiconductor memories such as large capacity dynamic random access memories (DRAMs). In particular, the invention relates to a semiconductor memory having a space-efficient layout by placing (master data line) MDQ switches into sense amplifier regions.

2. Description of Related Art

Large capacity memories typically contain sense amplifier banks between memory cell arrays. The sense amplifier banks occupy space on the surface of the chips. With demand for higher capacity memory chips, available surface area has become increasingly important to conserve and use as efficiently as possible. Memory chips are arranged in a plurality of rows and columns. A reduction in the size of a column, for example, could have a large impact on the size of the chip.

Referring to FIG. 1, a typical memory array 10 is shown. A sense amplifier bank 12 contains a plurality of sense amplifiers 14 for a column 16 of memory cells 18. Each column 16 of memory cells 18 includes a pair of complementary bit lines 20. During operation, a sense amplifier 14 "senses" a differential voltage between pair of complementary bit lines 20. During sensing the differential voltage, sense amplifier 14 amplifies the differential voltage to a bit line high voltage on one bit line of the pair and the other bit line is grounded. Either line can be driven high (bit line high) or low (ground) as required. This allows the memory cells in that column to store either a high or low bit as needed. A region 22 is shown containing three sense amplifiers 14 and a portion of a stitch-region 23, where no memory cells are located. Further in a segmented word line architecture, a local word line driver may be located in a corresponding free region.

Referring to FIG. 2, sense amplifier 14 usually contains large transistors used for driving the two separated halves of sense amplifier 14. The two halves of sense amplifier 14 include a P-amplifier 24 and an N-amplifier 26. Stitch-region 23 generally runs adjacent to columns 16, and stitch-region 23 has the same basic orientation as columns 16. Stitch-region 23 is an intermittent space, free of bit lines 20, hence creating space in which it is convenient to place necessary components. Regions for a multiplexing circuit containing isolation transistors are located in MUX regions 28 and 30. A bit line equalizer circuit containing equalization transistors are located in EQ regions 32 and 34. EQ regions 32 and 34 can be shared if one EQ is located between MUX regions 28 and 30. Both the MUX and EQ regions are allocated towards the ends of the sense amplifier bank 12 (FIG. 1).

P-amplifier 24 is located in the P-amplifier region 36 and N-amplifier 26 is located in the N-amplifier region 38. The transistors located in the stitch-region 23 include a PFET transistor (PFET) driver and an NFET transistor (NFET) driver 42. As mentioned, sense amplifier 14 includes an N-amplifier 38 and a P-amplifier 36. N-amplifier 38 is controlled by signal NFET driven by an NFET driver 42, and P-type amplifier 40 is controlled by signal PFET driven by a PFET driver 40. PFET 40 and NFET 42 drivers are usually used to drive a plurality of P-amplifiers or N-amplifiers as the case may be. PFET drivers 40 and NFET drivers 42 tend to be relatively large. A common placement location for PFET driver 40 and NFET driver 42 is within stitch-region 23 since there is space available for such placement. However, as demand increases this space becomes inadequate for placement of these devices. Further, PFET driver 40 requires placement over an N-well while NFET driver requires placement over a P-well. This further limits placement of PFET driver 40 to an area adjacent P-amplifier region 24 within stitch region 23 and NFET driver 42 adjacent to N-amplifier region 26, EQ regions 32 and 34 or MUX regions 28 and 30 within stitch region 23.

It is advantageous to be able to place a portion of PFET driver 40 and NFET driver 42 within regions 24 and 26, respectively, in order to better accommodate PFET driver 40 and NFET driver 42. Having drivers 40 and 42 within their respective amplifier regions will reduce RC time delays. However, such placement may cause bit lines to be rerouted due to contacts required to sources, gates and drains of PFET driver 40 and NFET driver 42.

Referring to FIG. 3, bit lines 20 are shown routed around contacts 46, 48 and 50. Contacts 46 and 50 extend downward to an active area AA through layer M0 which is the layer in which bit lines 20 are located. Metal lines 54 and 56 are used for connecting source 58 and drain 60 of NFET driver 42. N-amplifier 26 is shown schematically. Contact 48 of NFET driver 42 must also be avoided by bit lines 20. The rerouting of bit lines 20 reduces the available chip area reducing the space efficiency of the chip layout which is in direct conflict to the desire to reduce chip size.

Referring to FIG. 4, bit lines 20 are shown routed around contacts 46', 48' and 50'. Contacts 46' and 50' extend downward to an active area AA through layer M0 which is the layer in which bit lines 20 are located. Metal lines 54' and 56' are used for connecting source 58' and drain 60' of PFET driver 40'. P-amplifier 24 is shown schematically. Contact 48' of PFET driver 40 must also be avoided by bit lines 20. Again, the rerouting of bit lines 20 reduces the available chip area reducing the space efficiency of the chip layout which is in direct conflict to the desire to reduce chip size.

Space-efficient layouts have attempted to place devices such as master data line switches (MDQ switches) adjacent to sense amplifier bank to reduce overall chip layout area. MDQ switches are generally sparsely distributed across a chip. It is, therefore, desirable to place such devices in available free spaces to conserve layout area on a semiconductor memory chip.

Therefore, a need exists for placing MDQ switches within available space to create a more space-efficient layout without having to significantly reroute bit lines which could impact the overall size of the chip.

SUMMARY OF THE INVENTION

A semiconductor memory having a plurality of memory cells arranged in rows and columns includes a bank of sense amplifiers disposed in a first generally rectangular region having a length parallel to said rows, with each sense amplifier in the bank disposed in a sense amplifier region between a pair of complementary bit lines of an associated column. An MDQ switch being located in a sense amplifier region occupying a corresponding row-wise space to the at least one driver to provide space efficient placement thereof.

BRIEF DESCRIPTION OF DRAWINGS

The invention will be described in detail in the following description of preferred embodiments with reference to the following figures wherein.

DETAILED DESCRIPTION OF THE INVENTION

Random access memory (DRAM) chips such as dynamic RAMs (DRAMs), synchronous DRAMs (SDRAMs), or merged DRAM-logic chips (embedded DRAMs), contain many sense amplifier banks. The continued desire to reduce the size of chips while increasing the density of features on the chip forces technology in the direction of efficient use of chip layout area. A rectangular stitch-region is typically used to accommodate the large PFET and NFET drivers. To reduce time delays and accommodate larger sized drivers, it is convenient to be able to distribute all or a part of the PFET driver and NFET driver among other portions of the layout area. However, placement of these drivers within the sense amplifier region requires bit lines to be routed around contacts to the source, drain and gate of the drivers. By reducing the number of contacts passing through the bit line metal layer M0, PFET and NFET drivers may be placed within the sense amplifier region and enable bit line routing or reduce the amount of rerouting around contacts. This results in a more efficient layout.

Figure 5:
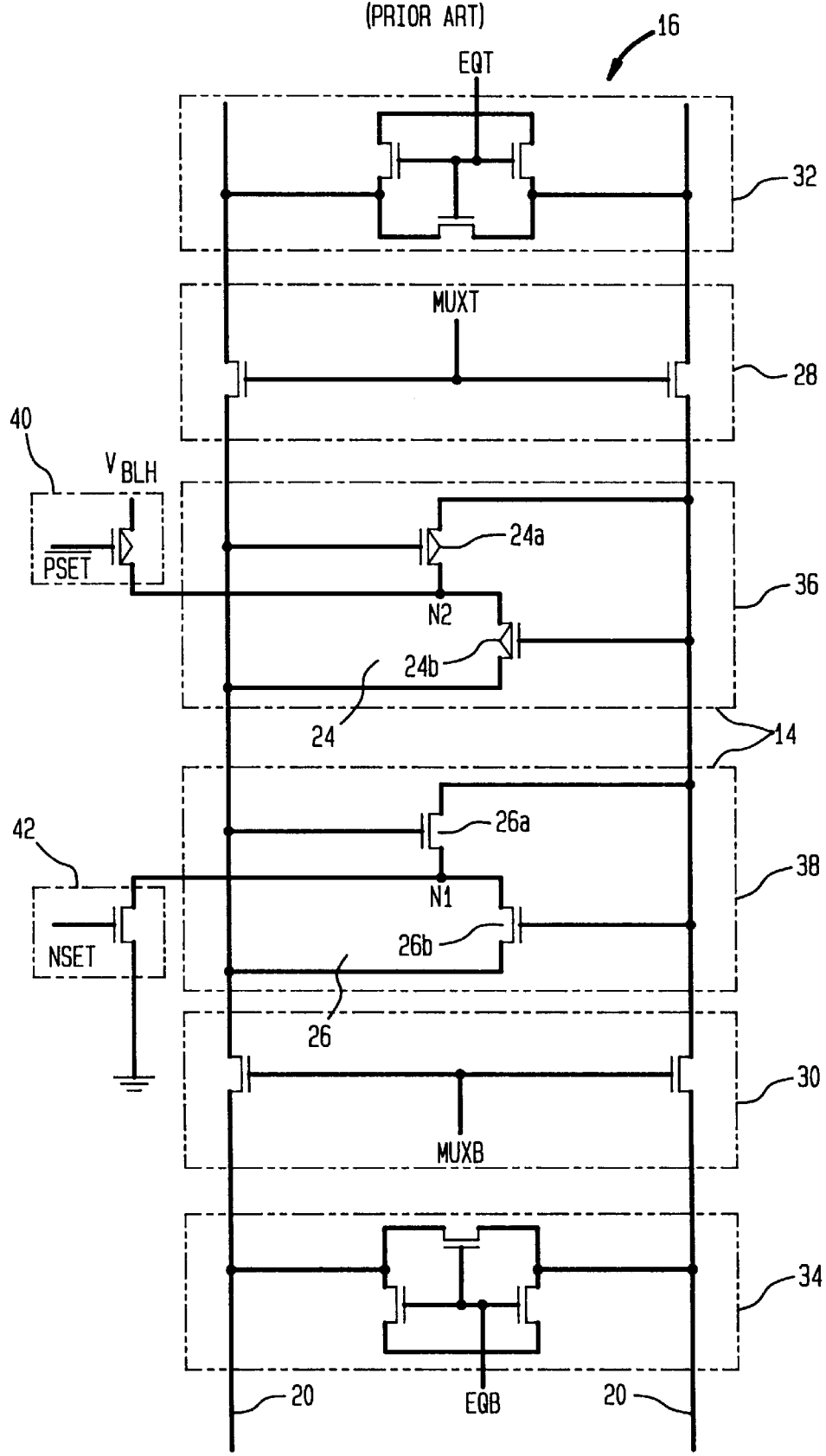
FIG. 5 is a prior art schematic diagram of a column showing sense amplifier circuitry with a PFET driver and an NFET driver outside a sense amplifier's amplifier regions.

Referring to FIG. 5, a schematic diagram representation of a prior art sense amplifier 14 is shown. Bit lines 20 delineate a column 16 in which sense amplifier 14 is disposed. PFET driver 40 and NFET driver 42 are shown outside column 16 and are placed, for example, in a row decoder (not shown). Equalizer circuit 32 and 34 are shown as well. MUX isolation switches in MUX regions 28 and 30 are also shown. N-amplifier region 26 contains two N-type transistors 26a and 26b. N-type transistors 26a and 26b are connected such that the source of one is the drain of the other at node N1. NFET driver 42 has its drain connected to N1 as well. P-amplifier region 24 contains two P-type transistors 24a and 24b. P-type transistors 24a and 24b are connected such that the source of one is the drain of the other at node N2. PFET driver 40 has its drain connected to N2 as well. Both NFET driver 42 and PFET driver 40 are located outside the boundaries of sense amplifier 14. Although a single column is shown for purposes of discussion, NFET driver and PFET driver often drive a plurality of sense amplifiers. For example, the drivers may drive 512 sense amplifiers.

Figure 6:
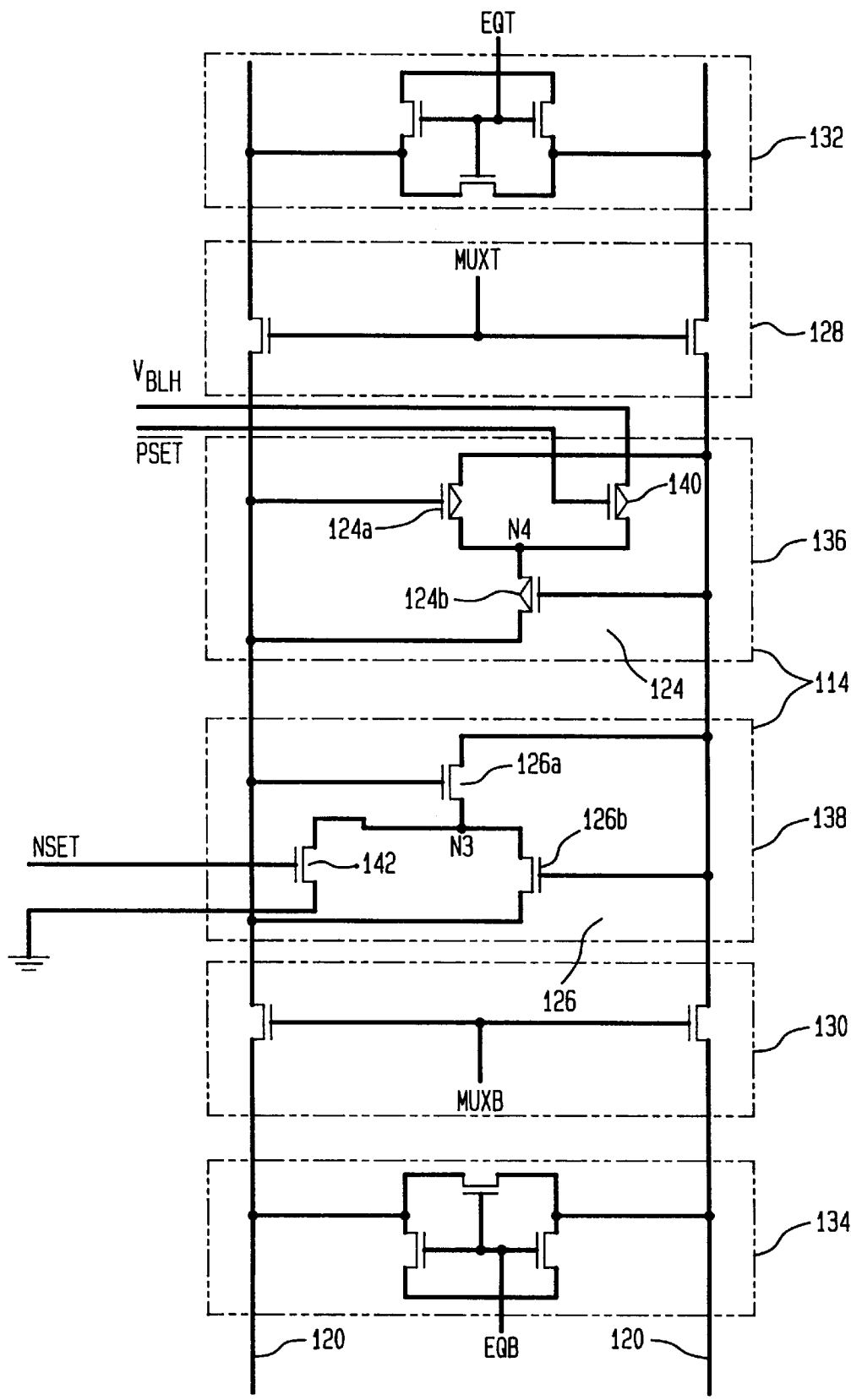
FIG. 6 is a schematic diagram of a column showing sense amplifier circuitry with a PFET driver and an NFET driver inside a sense amplifier's amplifier regions.

Referring to FIG. 6, a schematic representation of a sense amplifier 114 having PFET driver 140 and NFET driver 142 moved into sense amplifier region is shown. Bit lines 120 delineate a column 116 in which sense amplifier 114 is disposed. PFET driver 140 and NFET driver 142 are shown inside their corresponding amplifier region. For example, NFET driver 142 is located within N-amplifier region 126 and PFET driver 140 is located within P-amplifier region 124. Equalizer circuit 132 and 134 are shown as well as MUX isolation switches in MUX regions 128 and 130. N-amplifier region 126 contains two N-type transistors 126a and 126b as well as NFET driver 142. N-type transistors 126a and 126b are connected such that the source of one is the drain of the other at node N3. NFET driver has its drain connected to N3 as well. P-amplifier region 124 contains two P-type transistors 124a and 124b as well as PFET driver 140. P-type transistors 124a and 124b are connected such that the source of one is the drain of the other at node N4. PFET driver 140 has its drain connected to N4 as well. Both NFET driver 142 and PFET driver 140 are located inside the boundaries of sense amplifier 114. In this way RC delays are reduced by reducing the distance between the drivers and the amplifiers.

Figure 4:
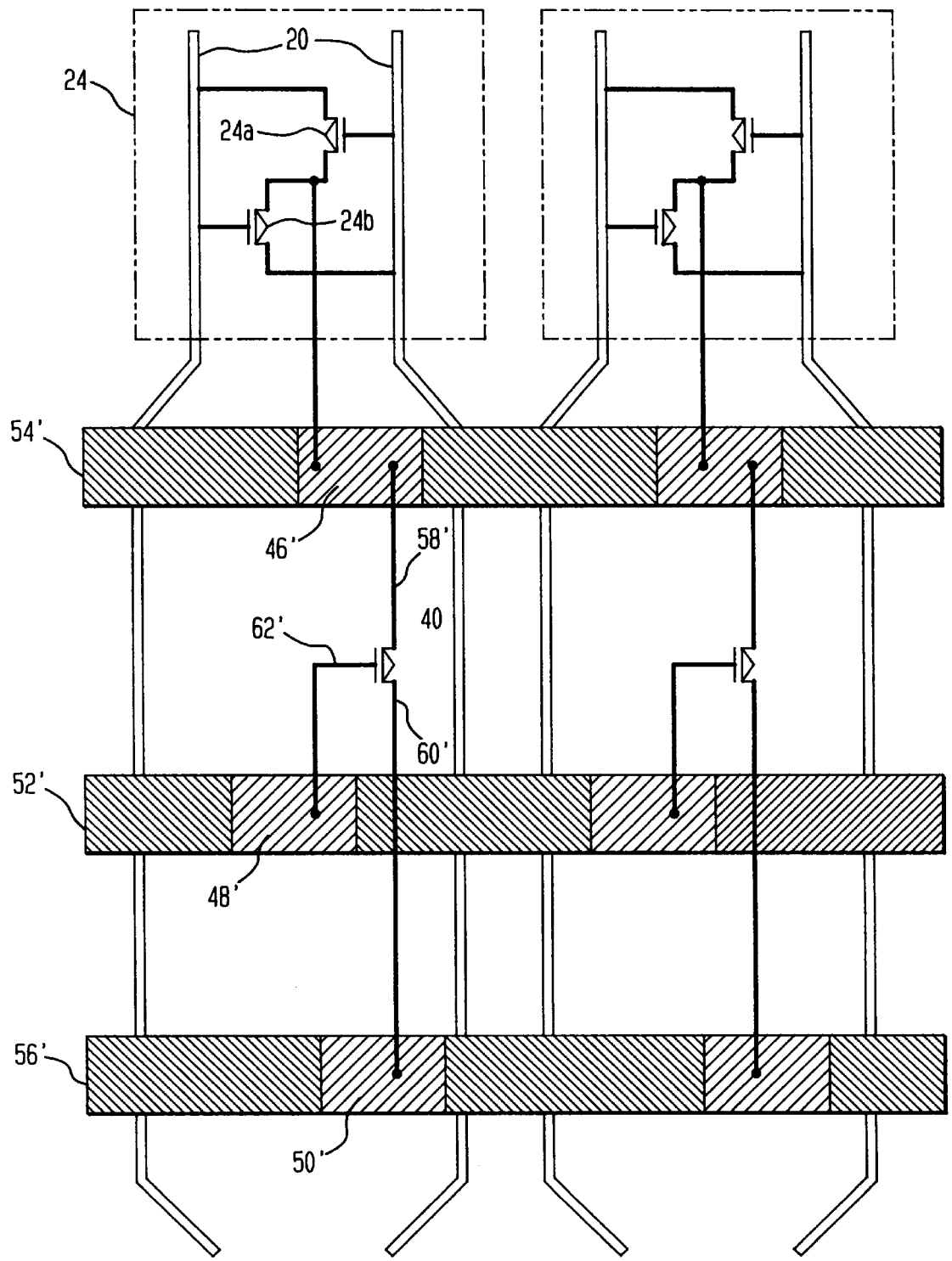
FIG. 4 is a prior art schematic diagram showing an P-amplifier and an PFET driver located in the P-amplifier region with contacts for each source, drain and gate for each PFET driver and showing rerouted bit lines.

In order to realize the advantages of placing drivers 140 and 142 into the sense amplifier region, it is necessary to address the problem of bit line rerouting around the source, gate and drain contacts as described in FIG. 4 hereinabove. This problem is addressed in reducing the number of contacts in which bit lines 120 must bypass.

Figure 3:
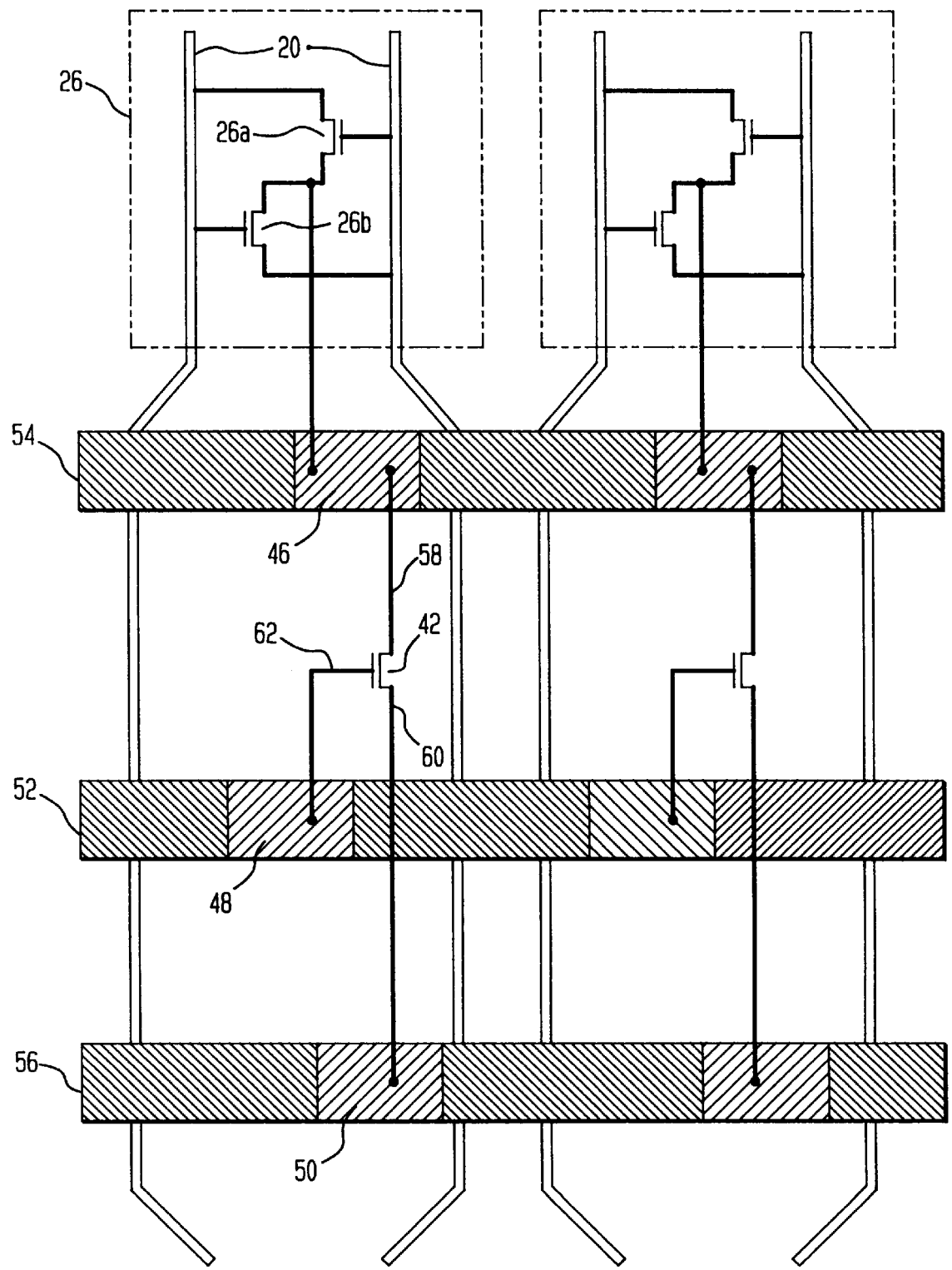
FIG. 3 is a prior art schematic diagram showing an N-amplifier and an NFET driver located in the N-amplifier region with contacts for each source, drain and gate for each NFET driver and showing rerouted bit lines.
Figure 7:
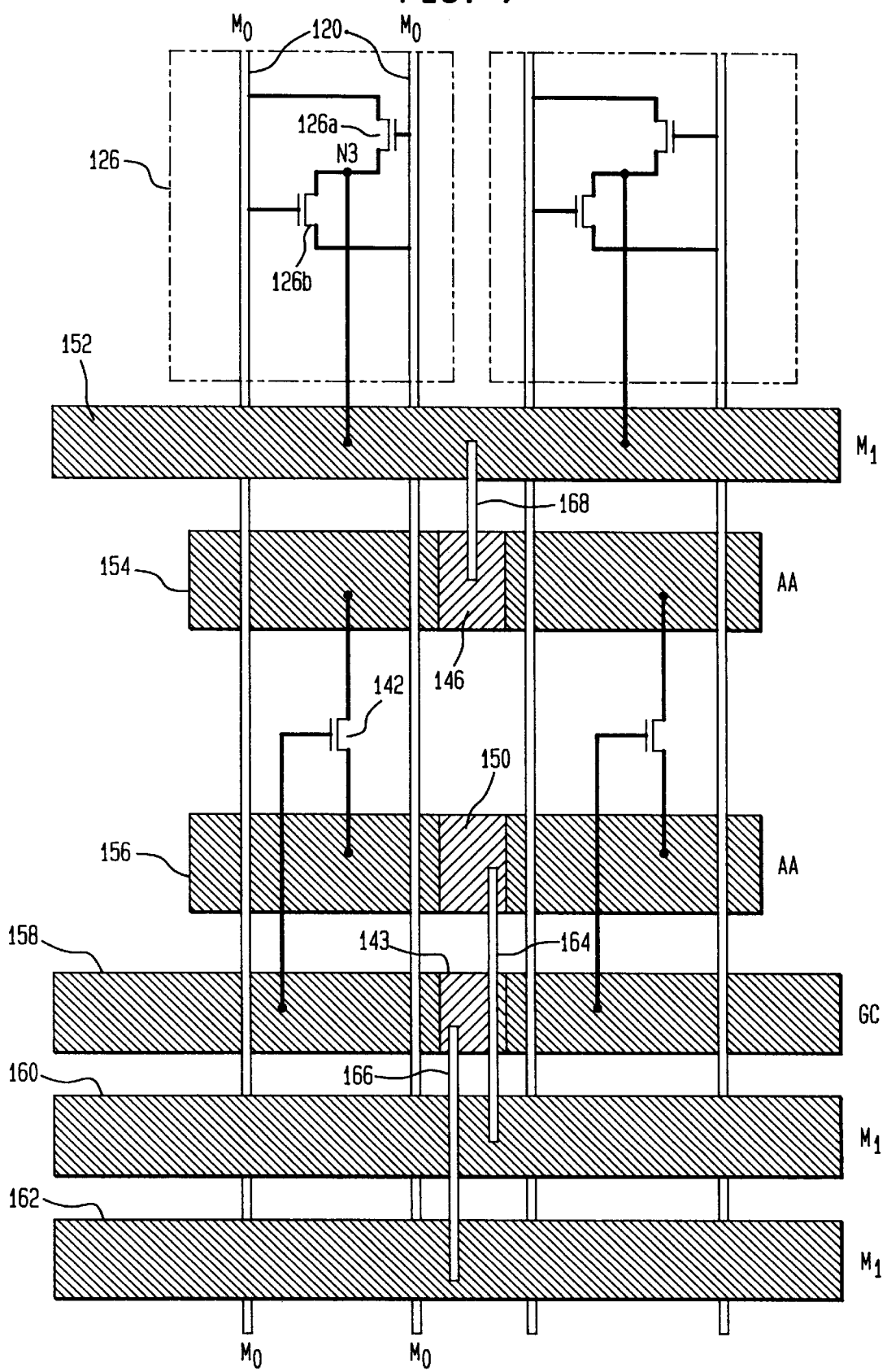
FIG. 7 is a schematic diagram showing an N-amplifier region with a reduced number of contacts for connecting a plurality of NFET drivers to global metal lines and also showing bit lines with rerouting minimized.

Referring to FIG. 7, a schematic diagram shows the invention of the present disclosure. Contacts 146, 148 and 150 are used to replace contacts 46, 48 and 50 of FIG. 3. The total number of contacts can be significantly reduced since a plurality of prior art sense amplifier contacts 46, 48 and 50 are replaced by contacts 146, 148 and 150. N-amplifier 126 has N-amplifier transistors 126a and 126b shown disposed between bit lines 120. A first diffusion region 154 is shared by NFET drivers 142. A plurality of NFET drivers 142 can be connected to region 154 which is the drain, for example for all NFET drivers 142 connected thereto. First diffusion region 154 is located within an active area (AA). AA represents the lowest level in a chip layout. The next level up is gate conductor (GC), M0, the next is M1 and so on. Bit lines 120 are on level M0 which pass over level AA and therefore pass over region 154. A second diffusion region 156 is also located on level AA. A plurality of NFET drivers 142 can be connected to region 156 which is the source, for example, for all NFET drivers 142 connected thereto.

Region 154 is connected to a global metal line 152 located on a higher level, for example M1, by contact 146. Contact 146 connects a plurality of the sources of NFET drivers 142 through a single contact 146. Global metal line 152 is unnecessary if NFET driver 142 shares diffusion region 154 with N-amplifier 126 at N3. This replaces the contacts required previously which had one contact, for example contact 46 of FIG. 3, for each sense amplifier column. Contact 146 can replace many prior art contacts, for example 512 contacts. Contact 146 represents the layout area used while a connection 168 is made to global metal line 152. In one embodiment, global metal line 152 is directly above region 154. See FIG. 9.

Contact 150 connects a plurality of the sources of NFET drivers 142 therethrough. This replaces the contacts required previously which had one contact, for example contact 50 of FIG. 3, for each transistor source. Contact 150 can replace many prior art contacts, for example 512 contacts. Contact 150 connects a global ground metal line 160 to region 156. Contact 150 is represented by a connection 164 is made to global ground metal line 160. In one embodiment, global ground metal line 160 is directly above region 156. See FIG. 9.

Contact 148 connects a plurality of the gates of NFET drivers 142 therethrough. This replaces the contacts required previously which had one contact, for example contact 48 of FIG. 3, for each transistor gate. Contact 148 can replace many prior art contacts, for example 512 contacts. Contact 148 connects a gate conductor 158 to global gate connection metal line 162. In one embodiment, gate conductor 158 may be sufficient to connect the gates of a plurality of NFET drivers 142 thus obviating the need for global gate connection metal line 162 thereby reducing the number of contacts further. See FIG. 9. The omission of global gate connection metal line 162 can occur if the resistance in gate conductor 158 is low enough. Contact 148 represents the layout area used while a connection 166 is made to global gate connection metal line 160. In one embodiment, global gate connection metal line 160 is directly above gate conductor 158. See FIG. 9. In another embodiment, gate conductor 158 is oriented perpendicular to columns and is shared by many devices, for example a rotated driver device.

Figure 8:
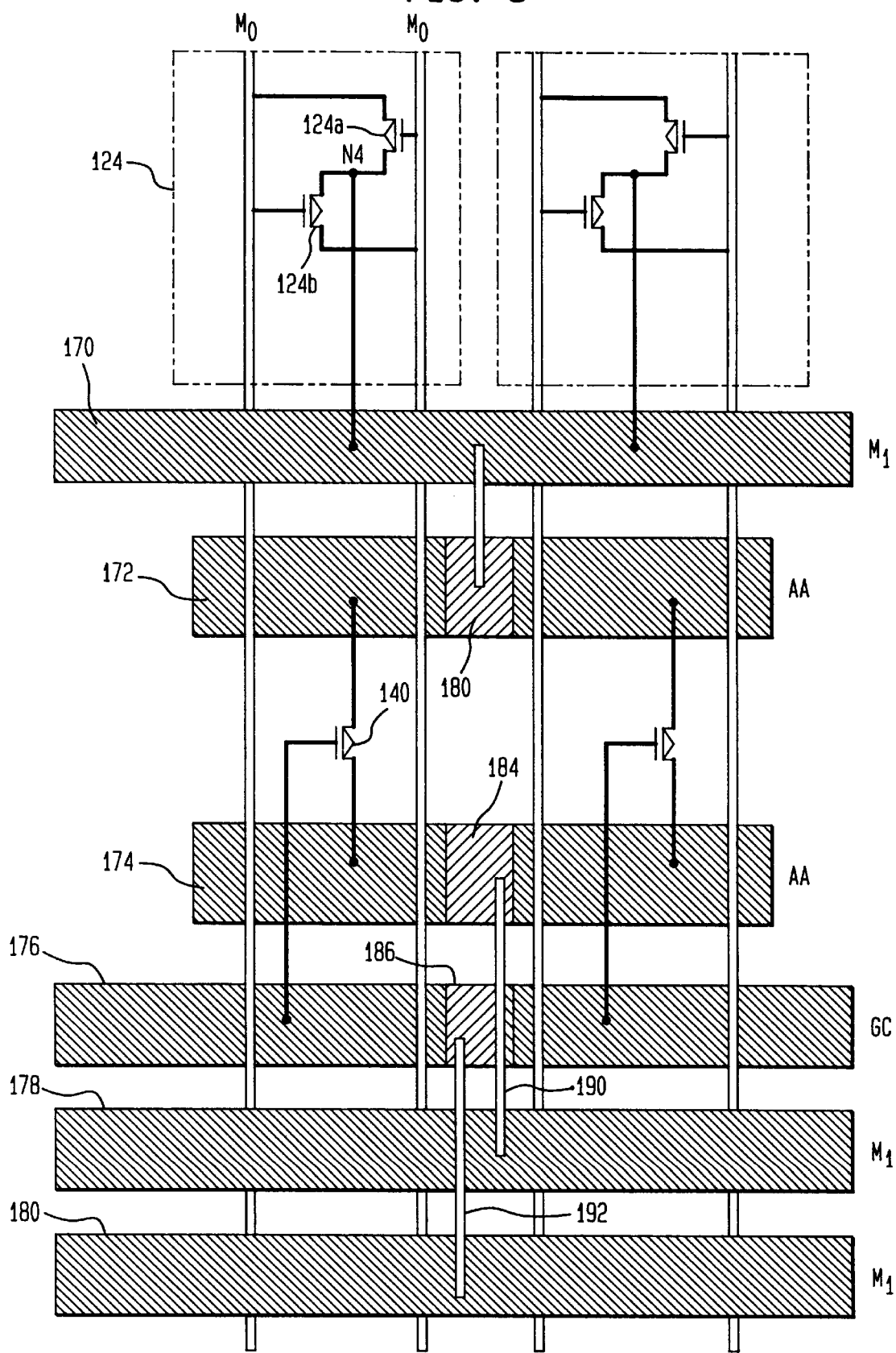
FIG. 8 is a schematic diagram showing a P-amplifier region with a reduced number of contacts for connecting a plurality of PFET drivers to global metal lines and also showing bit lines with rerouting minimized.

Referring to FIG. 8, P-amplifier 124 has P-amplifier transistors 124*a* and 124*b* shown disposed between bit lines 120. A first diffusion region 172 is shared by PFET drivers 140. A plurality of PFET drivers 140 can be connected to region 172 which is the drain, for example, for all PFET drivers 142 connected thereto. First diffusion region 172 is located within an active area (AA). AA represents the lowest level in a chip layout. The next level up is a gate conductor level (GC), M0, the next is M1 and so on. Bit lines 120 are on level M0 which pass over level AA and therefore pass over region 172. A second diffusion region 174 is also located within level AA. A plurality of PFET drivers 140 can be connected to region 174 which is the source, for example, for all PFET drivers 174 connected thereto.

Region 172 is connected to a global metal line 170 located on a higher level, for example M1, by contact 182. Global metal line 170 is unnecessary if PFET driver 140 shares diffusion region 172 with P-amplifier 124 at N4. Contact 182 connects a plurality of the drains of PFET drivers 140 through a single contact 182. This replaces the contacts required previously which had one contact, for example contact 46' of FIG. 4, for each sense amplifier column. Contact 182 can replace many prior art contacts, for example 512 contacts. Contact 182 represents the layout area used while a connection 188 is made to global metal line 170. In a preferred embodiment, global metal line 170 is directly above region 172. See FIG. 9.

Contact 184 connects a plurality of the sources of PFET drivers 140 therethrough. This replaces the contacts required previously which had one contact, for example contact 50' of FIG. 4, for each transistor source. Contact 184 can replace many prior art contacts, for example 512 contacts. Contact 184 connects a global ground metal line 178 to region 174. Contact 184 represents the layout area used while a connection 190 is made to global bit line high metal line 178. In one embodiment, global bit line high metal line 178 is directly above region 174. See FIG. 9.

Contact 186 connects a plurality of the gates of PFET drivers 140 therethrough. This replaces the contacts required previously which had one contact, for example contact 48' of FIG. 4, for each transistor gate. Contact 186 can replace many prior art contacts, for example 512 contacts. Contact 186 connects a local gate connection line 176 to global gate connection metal line 180. In one embodiment, gate conductor 176 may be sufficient to connect the gates of a plurality of PFET drivers 140, thus obviating the need for global gate connection metal line 180 which further reduces the number of contacts. See FIG. 10. The omission of global gate connection metal line 180 can occur if the resistance in gate conductor 176 is low enough. Contact 186 represents the layout area used while a connection 192 is made to global gate connection metal line 178. In one embodiment, global gate connection metal line 178 is directly above gate conductor 176. See FIG. 9. In another embodiment, gate conductor 176 is oriented perpendicular to columns and is shared by many devices, for example a rotated driver device.

As shown in FIGS. 7 and 8, contacts 146, 148, 150, 182, 184 and 186 greatly reduce the number of contacts needed to place PFET driver 140 and NFET driver 142 within sense amplifier 114. Since the number of contacts is reduced, bit line rerouting around contact areas is reduced or makes bit line rerouting possible. As a result, a more space efficient layout for the chip is provided. In one embodiment contacts are formed such that contacts 146, 148, 150, 182, 184 and 186 fit between bit lines 120 thereby not requiring significant rerouting of bit lines 120.

Figure 9:
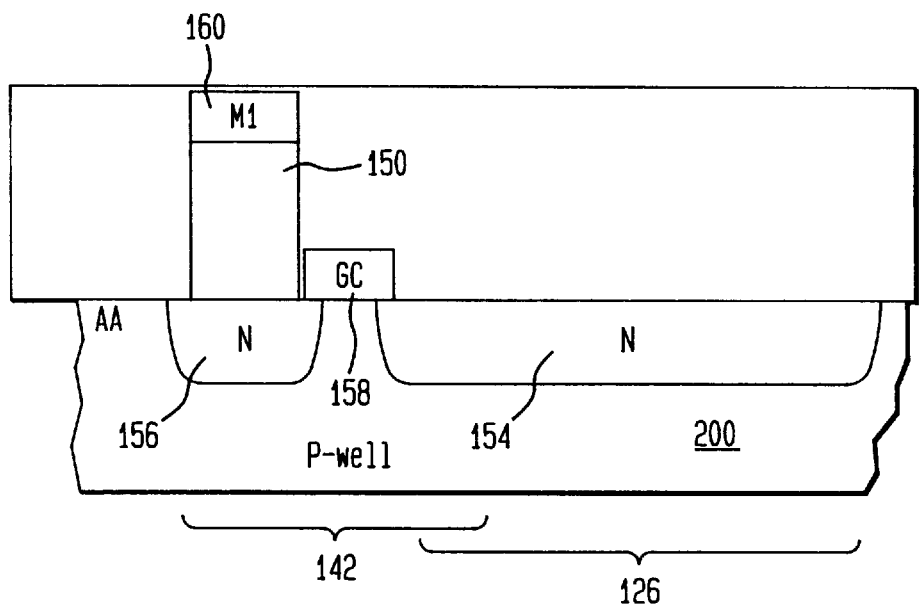
FIG. 9 is a cross sectional view of an N-amplifier region taken parallel to and in between a complementary pair of bit lines showing diffusion region sharing between NFET driver and N-amplifier.

Referring to FIG. 9, a cross section of an embodiment is shown having global metal line 160 disposed directly above diffusion region 156 of NFET driver 142. Contact 150 connects global metal line 160 to diffusion region 156. NFET driver 142 has gate conductor 152 disposed between diffusion region 154 and diffusion region 156. In one embodiment diffusion region 154 extends transversely, preferably perpendicularly, to diffusion region 156 in order to more effectively use available space. A plurality of NFET drivers 142 may share diffusion region 156. In an alternate embodiment, diffusion region 156 is shared with N-amplifier 126.

Figure 1:
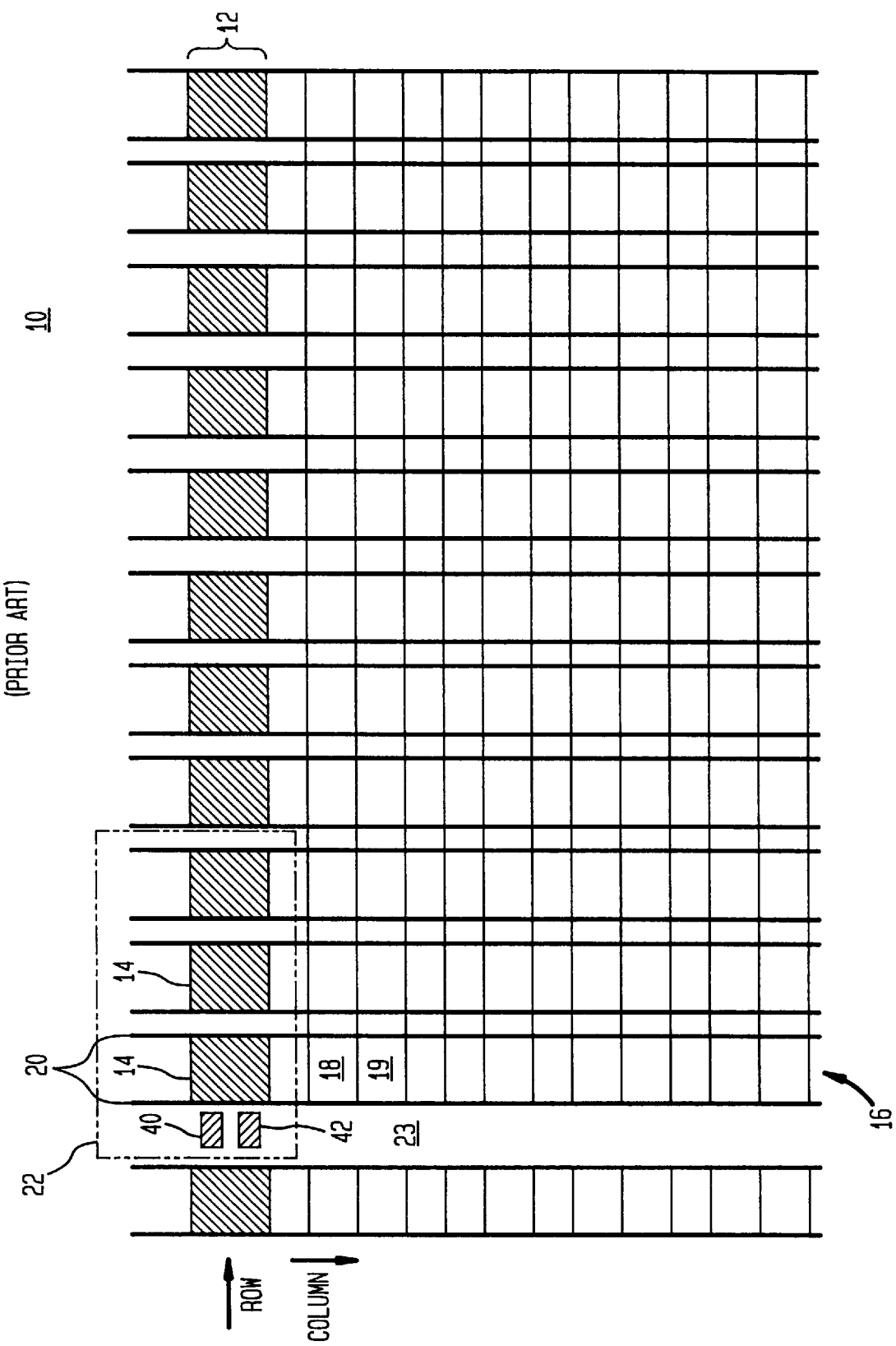
FIG. 1 is a plan view of a prior art sense amplifier bank layout for semiconductor memories.
Figure 2:
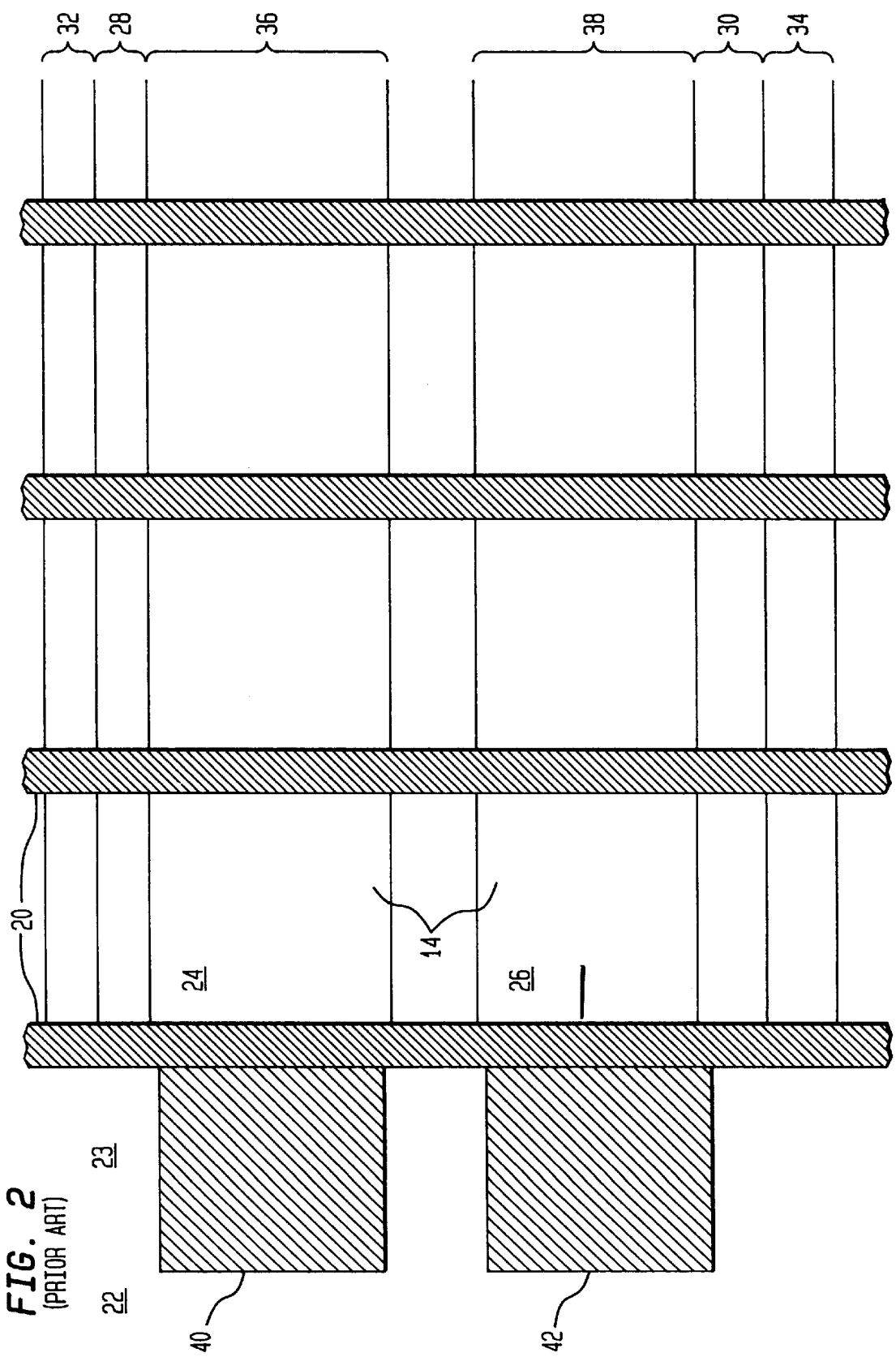
FIG. 2 is an exploded plan view of a prior art region 22 shown in FIG. 1 showing a stitch-region and several columns in a sense amplifier bank.

FIG. 9 shows the cross section of N-amplifier region 38 of sense amplifier bank 12 (see FIG. 2) with metal lines 152 and 162 and contacts 146 and 148 omitted. P-well 200 is located in N-amplifier region 38 (FIG.2). Diffusion region 154 and diffusion region 156 are N-doped. In a preferred embodiment, diffusion region 154 is used as by N-amplifier transistors 126*a* or 126*b* thereby allowing diffusion region 154 to be shared, for example, by N-amplifier transistors 126*a* and 126*b* and NFET driver 142 . This reduces the number of contacts further and reduces the number of global metal lines over the sense amplifier region.

P-well 200 with diffusion regions 154 and 156 are located on level AA. Gate conductor 158 is located on GC. Bit line 120 is located on level M0 (not shown) between GC and M1. Global metal line 160 can be on level M1, M2 etc.

Figure 10:
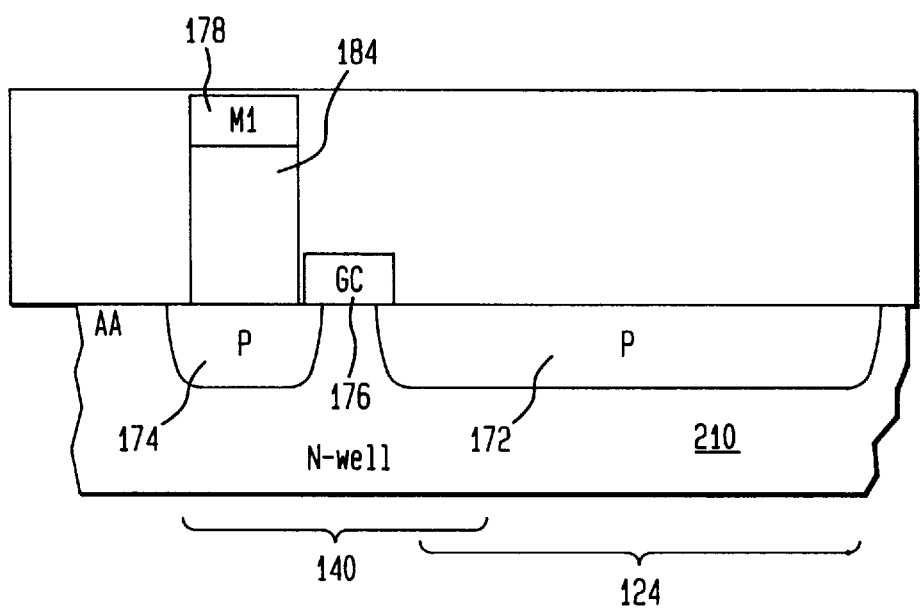
FIG. 10 is a cross sectional view of a P-amplifier region taken parallel to and in between a complementary pair of bit lines showing diffusion region sharing between PFET driver and P-amplifier.

Referring to FIG. 10, a cross section of an embodiment is shown having global metal line 178 disposed directly above diffusion region 174 of PFET driver 140. Contact 184 connects global metal line 178 to diffusion region 174. PFET driver 140 has gate conductor 176 disposed between diffusion region 172 and diffusion region 174. In one embodiment, diffusion region 174 extends transversely preferably perpendicularly to diffusion region 172 in order to more effectively use available space. A plurality of PFET drivers 140 may share diffusion region 174. In an alternate embodiment, diffusion region 174 is shared with P-amplifier 126.

FIG. 10 shows the cross section of P-amplifier region 36 of sense amplifier bank 12 (see FIG. 2) with global metal lines 170 and 180 and contacts 182 and 186 omitted. N-well 210 is located in P-amplifier region 36 (FIG.2). Diffusion region 172 and diffusion region 174 are P-doped. In one embodiment, diffusion region 172 is used by N-amplifier transistors 124a or 124b thereby allowing diffusion region 172 to be shared, for example, by P-amplifier transistors 124a and 124b and PFET driver 140. This reduces the number of contacts further and reduces the number of global metal lines over the sense amplifier region.

N-well 210 with diffusion regions 172 and 174 are located on level AA. Gate conductor 176 is located on GC. Bit line 120 is located on level M0 (not shown) between GC and M1. Global metal line 178 can be on level M1, N2 etc.

Figure 11:
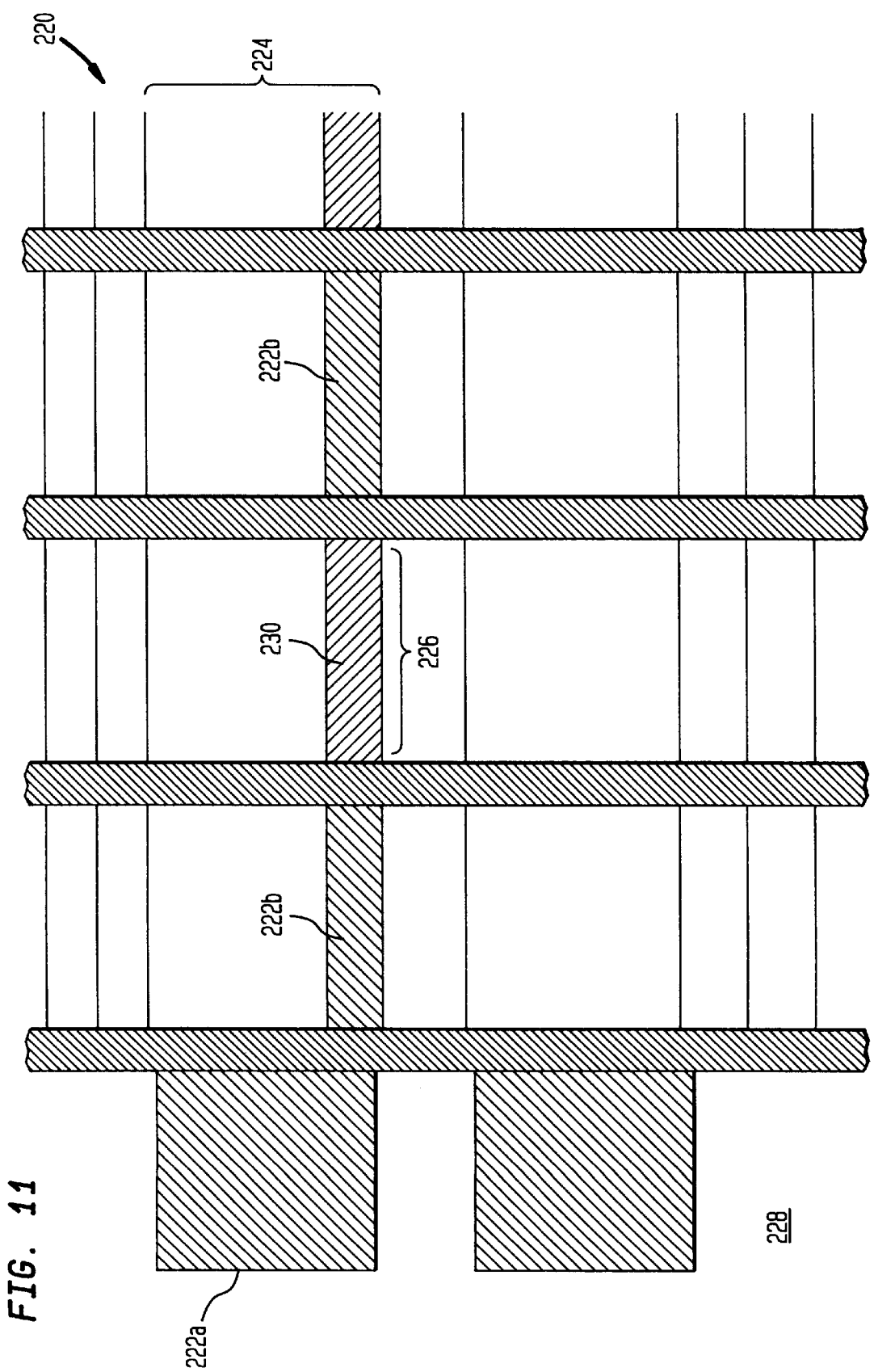
FIG. 11 is a plan view of a sense amplifier bank showing a driver distributed in an amplifier region and showing an MDQ switch distributed between segments of the driver.

Referring to FIG. 11, a driver 222 is distributed in sense amplifier bank. Driver 222 may be, for example, an NFET driver or a PFET driver. A first portion 222a of driver is located in stitch region or a free space created for a local word line driver 228 and a second portion 222b is located in an amplifier region 224, for example the N-amplifier region or the P-amplifier region depending on the driver used. Second portion 222b may have segmented portions. Regions 226 between the segmented portions of either PFET driver or NFET driver can be occupied by master data line (MDQ) switches 230 or a portion of MDQ switches. MDQ switch 230 includes suitable logic circuitry which receives the row address from an address buffer to determine which array to select. MDQ switch placement is explained in an article entitled "A 286 mm$^2$ 256 Mb DRAM with X32 Both-Ends DQ" by Watanabe et al. printed in IEEE Journal of Solid-State Circuits, Vol. 31 No. 4, April 1996. Watanabe is incorporated herein by reference. It is convenient and advantageous to place the MDQ switch between the segmented portions.

The embodiments described in this disclosure are applicable to layout architectures other than the stitch word line architecture mentioned. For example, the invention applies to segmented word line layout architectures. Further, various shaped diffusion regions are also contemplated in addition to the rectangular shaped regions depicted herein.

Having described embodiments of a space efficient MDQ switch placement (which are intended to be illustrative and not limiting), it is noted that the modifications and variations could be made by those skilled in the art in light of the above teachings. It is therefore to be understood that changes may be made in the particular embodiments of the invention disclosed which are within the scope and spirit of the invention defined by the appended claims.

What is claimed is:

1. A semiconductor memory having a plurality of memory cells arranged in rows and columns, the memory comprising:
   a bank of sense amplifiers disposed in a first generally rectangular region having a length parallel to said rows, with each sense amplifier in the bank disposed in a sense amplifier region of an associated column;
   a plurality of amplifiers driven by at least one driver, each of the plurality of amplifiers disposed between a pair of complementary bit lines and located within the sense amplifier region;
   the at least one driver being located in sense amplifier region and extending transversely to the column direction; and
   an MDQ switch being located in a sense amplifier region occupying a corresponding row-wise space to the at least one driver.

2. A semiconductor memory as recited in claim 1 wherein the at least one driver is divided into a first portion and a second portion, the first portion being placed in a first region, the second portion being placed in the sense amplifier region.

3. A semiconductor memory as recited in claim 2 wherein the second portion is segmented between complementary pairs of bit lines.

4. A semiconductor memory as recited in claim 3 wherein the MDQ switch is segmented and disposed between the segmented portions of the second portion.

5. A semiconductor memory as recited in claim 1 wherein the driver is an NFET driver and the MDQ switch is disposed in an N-amplifier region.

6. A semiconductor memory as recited in claim 1 wherein the driver is a PFET driver and the MDQ switch is disposed in an P-amplifier region.

7. A semiconductor memory having a plurality of memory cells arranged in rows and columns, the memory comprising:
   a bank of sense amplifiers disposed in a first generally rectangular region having a length parallel to said rows, with each sense amplifier in the bank disposed in a sense amplifier region of an associated column;
   a plurality of P-amplifiers driven by at least one PFET driver, each of the plurality of P-amplifiers disposed between a pair of complementary bit lines and located within the sense amplifier region;
   the at least one PFET driver being located in the sense amplifier region and extending transversely to the column direction, the PFET driver having segmented portions disposed between complementary pairs of bit lines; and
   an MDQ switch being located in the P-amplifier region in a corresponding row-wise space to the PFET driver between the segmented portions.

8. A semiconductor memory as recited in claim 7 wherein the plurality of P-amplifiers are a plurality of N-amplifiers driven by at least one NFET driver located in an N-amplifier region and the MDQ switch is located in the N-amplifier region in a corresponding row-wise space to the NFET driver between the segmented portions.

* * * * *